United States Patent
Harris et al.

(10) Patent No.: US 7,994,017 B2
(45) Date of Patent: Aug. 9, 2011

(54) METHOD OF MANUFACTURING SILICON CARBIDE SELF-ALIGNED EPITAXIAL MOSFET FOR HIGH POWERED DEVICE APPLICATIONS

(75) Inventors: Christopher Harris, Taby (SE); Kent Bertilsson, Sundsvall (SE); Andrei Konstantinov, Sollentuna (SE)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 12/603,603

(22) Filed: Oct. 22, 2009

(65) Prior Publication Data
US 2010/0041195 A1  Feb. 18, 2010

Related U.S. Application Data

(62) Division of application No. 11/711,703, filed on Feb. 28, 2007, now Pat. No. 7,629,616.

(51) Int. Cl.
*H01L 21/336* (2006.01)

(52) U.S. Cl. .......... 438/429; 438/44; 438/222; 438/666; 438/903; 438/969; 257/592; 257/665; 257/734; 257/E21.135; 257/E23.141

(58) Field of Classification Search ................. 438/268, 438/44, 222, 226, 241, 269, 363, 384, 388, 438/413, 416, 429, 442, 478, 481, 486, 489, 438/492–509, 571, 597, 607, 666, 903, 969; 257/E21.41, 592, 664, 665, 734–786, 929, 257/E21.135, E21.21, E21.627, E21.641, 257/E23.01, E23.079, E23.141, E29.111, 257/E29.165

See application file for complete search history.

(56) References Cited

U.S. PATENT DOCUMENTS

| | | | |
|---|---|---|---|
| 6,096,607 A | 8/2000 | Ueno | |
| 6,127,695 A | 10/2000 | Harris et al. | |
| 6,297,533 B1 | 10/2001 | Mkhitarian | |
| 6,573,534 B1 | 6/2003 | Kumar et al. | |
| 2004/0084724 A1 | 5/2004 | Kapels et al. | |
| 2008/0050876 A1 | 2/2008 | Matocha et al. | |

*Primary Examiner* — Matthew Smith
*Assistant Examiner* — Walter H Swanson
(74) *Attorney, Agent, or Firm* — Withrow & Terranova, P.L.L.C.

(57) ABSTRACT

A self-aligned, silicon carbide power metal oxide semiconductor field effect transistor includes a trench formed in a first layer, with a base region and then a source region epitaxially regrown within the trench. A window is formed through the source region and into the base region within a middle area of the trench. A source contact is formed within the window in contact with a base and source regions. The gate oxide layer is formed on the source and base regions at a peripheral area of the trench and on a surface of the first layer. A gate electrode is formed on the gate oxide layer above the base region at the peripheral area of the trench, and a drain electrode is formed over a second surface of the first layer.

20 Claims, 10 Drawing Sheets

METHOD OF MANUFACTURING SILICON CARBIDE SELF-ALIGNED EPITAXIAL MOSFET FOR HIGH POWERED DEVICE APPLICATIONS

CROSS-REFERENCE TO RELATED APPLICATIONS

This application is a divisional application of application Ser. No. 11/711,703 filed on Feb. 28, 2007, now U.S. Pat. No. 7,629,616, which is hereby incorporated for all purposes.

BACKGROUND OF THE INVENTION

1. Field of the Invention

The present invention relates to a silicon carbide self-aligned MOSFET (metal oxide semiconductor field effect transistor) having epitaxial re-grown layers for use in high powered device applications, and a method of manufacturing a silicon carbide self-aligned MOSFET having epitaxially re-grown layers.

2. Description of the Background Art

Silicon carbide (SiC) power MOSFETS are frequently made using a double-implanted MOSFET process (DIMOS), wherein implantation is used to create both the p-type base region and the n-type source region. An issue of concern is that the use of implantation damages the SiC. The quality of any oxide subsequently formed from the damaged SiC is poor. The reliability of SiC power MOSFETS is determined by how well the gate oxide is protected from the high voltage that the component must control.

SUMMARY OF THE INVENTION

In accordance with a first embodiment, a MOSFET is provided including in combination a first layer having opposite first and second surfaces and a trench extending from the first surface into the first layer, the first layer having a first conductivity type; a first epitaxial layer within the trench on sidewalls and a bottom of the trench, the first epitaxial layer having a second conductivity type opposite the first conductivity type; a second epitaxial layer within the trench on the first epitaxial layer, the second epitaxial layer having the first conductivity type; oxide spacers above the trench on the second epitaxial layer; a source contact within the trench between the oxide spacers and in contact with the first and second epitaxial layers; a gate oxide layer on the first surface of the first layer and on a surface of the first epitaxial layer above the trench that is not between the oxide spacers; a gate electrode on the oxide layer over the surface of the first epitaxial layer; and a drain electrode over the second surface of the first layer.

In accordance with a further embodiment, a method of manufacturing a MOSFET includes in combination forming a trench in a first layer, the first layer having opposite first and second surfaces, the trench extending into the first layer from the first surface; epitaxially growing a second layer and then a third layer within the trench and over the first surface of the first layer; etching the first and second layers using a mask to expose the first surface, to remove the third layer and part of the second layer within a middle area of the trench, and to expose a surface of the second layer in a peripheral area of the trench, to provide a first structure; forming a gate oxide layer on an entirety of the first structure; forming a gate electrode on the gate oxide layer over the surface of the second layer; etching the gate oxide layer within the middle area of the trench; forming a source electrode within the middle area of the trench in contact with the second and third layers; and forming a drain electrode over the second surface of the first layer, wherein the first and third layers have a conductivity type opposite a conductivity type of the second layer.

In accordance with a still further embodiment, a method of manufacturing a MOSFET is provided including in combination forming a trench in a first layer, the first layer having a first conductivity type and opposite first and second surfaces, the trench extending into the first layer from the first surface; epitaxially growing a second layer within the trench and on the first surface of the first layer, the second layer having a second conductivity type opposite the first conductivity type; epitaxially growing a third layer on the second layer within the trench and over the first surface of the first layer, the third layer having the first conductivity type; forming a first oxide layer on the third layer within the trench and over the first surface of the first layer; etching the first oxide layer substantially vertically so that the first oxide layer remains only over the trench as oxide spacers and so that the third layer is exposed between the oxide spacers, to provide a first structure; etching the first structure using the oxide spacers as a mask to expose the first surface, to remove the third layer and part of the second layer between the oxide spacers, and to expose a surface of the second layer within the trench that is not between the oxide spacers, to provide a second structure; forming a gate oxide layer on an entirety of the second structure; forming a gate electrode on the gate oxide layer over the surface of the second layer; etching the gate oxide layer between the oxide spacers; forming a source electrode between the oxide spacers in contact with the second and third layers; and forming a drain electrode over the second surface of the first layer.

BRIEF DESCRIPTION OF THE DRAWINGS

The above and other objects and features of the present invention will become apparent from the following description of the preferred embodiments made in connection with the accompanying drawings, in which.

DETAILED DESCRIPTION

Figure 1:
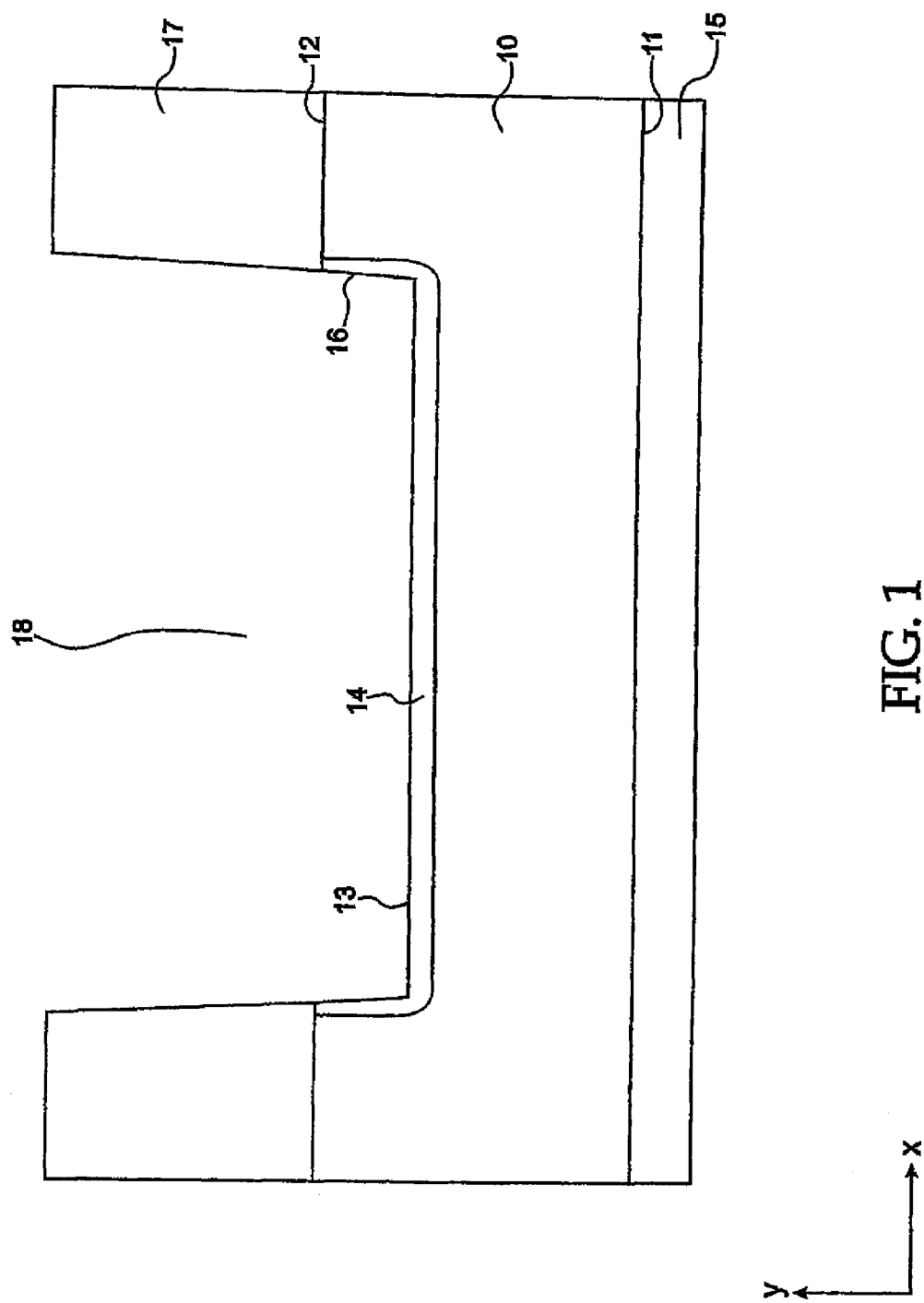
FIG. 1 illustrates a cross-section of the structure after etching a trench and implanting an optional impurity region.

The present invention will now be described more fully with reference to the accompanying drawings, in which preferred embodiments of the invention are shown. This invention may however be embodied in many different forms and should not be construed as limited to the embodiments set forth. Rather, the embodiments as described are provided so that this disclosure will be thorough and complete, and will fully convey the concept of the invention to those skilled in the art. In the drawings, the shape and thickness of the elements may be exaggerated for clarity, and are not necessarily drawn to scale. Also, like reference numbers are used to refer to like elements throughout the application. Description of well known methods and materials are omitted.

A method of manufacturing a self-aligned silicon carbide (SiC) power MOSFET (metal oxide semiconductor field effect transistor) of an embodiment is described beginning with reference to FIG. 1, which shows layer 10 having a top surface 12 and an opposite bottom surface 11. In this embodiment, layer 10 has n-type conductivity. Layer 10 may be characterized as a drift layer, and is shown as disposed on layer 15 which may be characterized as the substrate including any eventual buffer layer. Layer 10 has a thickness determined by the voltage to be controlled by the MOSFET, whereby the thickness is typically in the range of about 5 to 150 micrometers. Layer 10 has a dopant concentration in a range of about $1 \times 10^{14}$ cm$^{-3}$ to $5 \times 10^{16}$ cm$^{-3}$. Layer 15 may be characterized as including a substrate having thickness in the range of about 200 to 500 micrometers and a buffer layer having thickness in a range of about 0.5 to 2 micrometers. A concentration of layer 15 may be in a range of about $1 \times 10^{14}$ cm$^{-3}$ to $1 \times 10^{20}$ cm$^{-3}$. Layers 10 and 15 may be epitaxially grown during the same process, or separately, using metal organic chemical vapor deposition (MOCVD). Nitrogen or phosphorous may be used as n-type dopants.

A mask 17 is shown in FIG. 1 as patterned on top surface 12 of layer 10. Mask 17 may be a resist layer formed and patterned using standard photolithographic techniques, as would be understood by one of ordinary skill. The structure is subsequently etched using a dry etching technique (such as Reactive Ion Etching) to form trench 18 having a bottom surface 13 and sidewalls 16. Trench 18 may have a depth in a range of about 0.5 to 2.5 micrometers and a width in the horizontal or x-direction of FIG. 1 of at least 0.5 micrometers. In an optional process procedure, p$^+$-type impurity region 14 may be ion-implanted into bottom 13 of trench 18 through mask 17. Aluminum or boron may be used as a p-type dopant, and the dopant concentration of impurity region 14 may be in a range of about $5 \times 10^{18}$ cm$^{-3}$ to $1 \times 10^{20}$ cm$^{-3}$. The purpose of impurity region 14 will be described subsequently. It should be understood however that the MOSFET device as subsequently described is operational even without impurity region 14.

In a following process as described with reference to FIG. 2, after removal of mask 17 shown in FIG. 1, a p-type silicon carbide layer 20 is epitaxially regrown within trench 18 on bottom 13 and on sidewalls 16 of trench 18, and also on top surface 12 of layer 10. Layer 20 covers the structure as illustrated in its entirety. Since the crystal planes of silicon carbide layer 10 along bottom surface 13 and sidewalls 16 of trench 18 are not the same, epitaxial regrowth of silicon carbide within trench 18 is not uniform. That is, epitaxial regrowth in the horizontal direction (the x-direction as shown in FIG. 1) is typically significantly greater than epitaxial regrowth in the vertical direction (the y-direction as shown in FIG. 1) when using the Si-face of the SiC wafer. For example, the rate of epitaxial regrowth of silicon carbide in the horizontal direction can be about 3 times greater than the rate of epitaxial regrowth of silicon carbide in the vertical direction. In contrast, dopant incorporation of impurities is much greater during expitaxial regrowth of silicon carbide in the vertical direction than during epitaxial regrowth of silicon carbide in the horizontal direction. For example, the rate of dopant incorporation during epitaxial regrowth of silicon carbide in the vertical direction can be about 10 times greater than the rate of dopant incorporation during epitaxial regrowth of silicon carbide in the horizontal direction. The dopant concentration of layer 20 is dependent on whether or not impurity region 14 as described with respect to FIG. 1 is implanted in layer 10. In the case that impurity region 14 is implanted, the dopant concentration of layer 20 would be about $1 \times 10^{17}$ cm$^{-3}$, with dopant concentration of the side walls being correspondingly less. In the case that impurity region 14 is not implanted, the dopant concentration as noted above would be about 10 times greater. Also, as a result of this anisotropy in growth rate, epitaxially regrown silicon carbide layer 20 may have a thickness in a range of about 0.2 micrometers at bottom surface 13 of trench 18 and on top surface 12 of layer 10 for example. In contrast, the thickness of epitaxially regrown silicon carbide layer 20 on sidewalls 16 of trench 18 may be in a range of about 0.5 micrometers for example. The p-type silicon carbide layer 20 within trench 18 will serve as a p-type base region of the MOSFET device.

Figure 2:
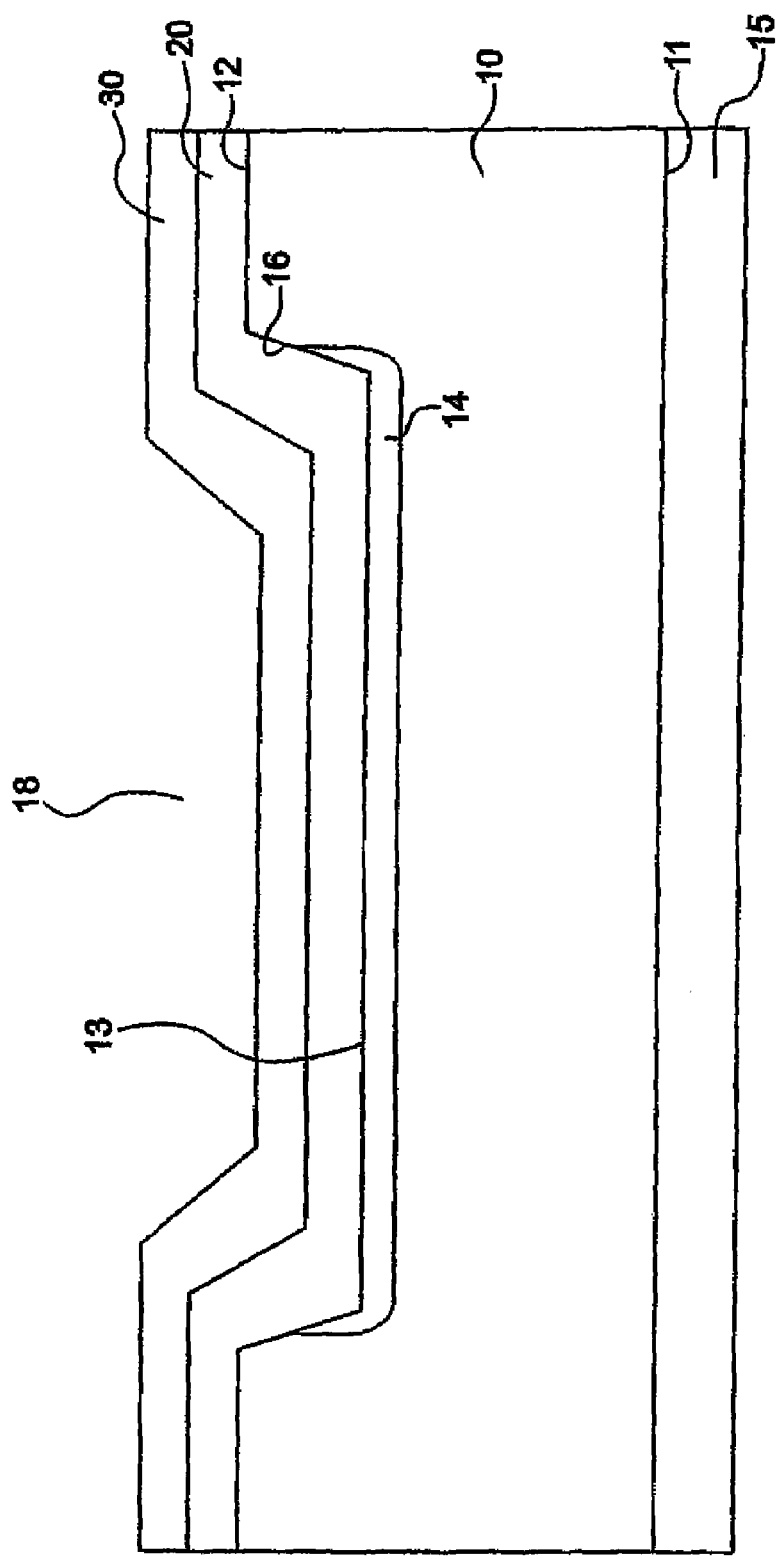
FIG. 2 illustrates a cross-section of the structure after epitaxial regrowth of a base region and a source region.

With further reference to FIG. 2, an n-type silicon carbide layer 30 is subsequently epitaxially regrown on p-type silicon carbide layer 20. Epitaxially regrown silicon carbide layer 30 is shown as entirely covering the surface of the structure as illustrated, as particularly on p-type silicon carbide layer 20 over bottom 13 and sidewalls 16 of trench 18, and as on p-type silicon carbide layer 20 over top surface 12 of layer 10. Epitaxially regrown silicon carbide layer 30 may have a thickness in a range of about 0.5 micrometers and a dopant concentration in a range of about $5 \times 10^{19}$ cm$^{-3}$. As should be understood by one of ordinary skill, the upper surface of the structure as shown in FIG. 2 is step-like, including an indentation or depression above trench 18. The n-type silicon carbide layer 30 within trench 18 will serve as an n$^+$-type source region of the MOSFET device.

Figure 3:
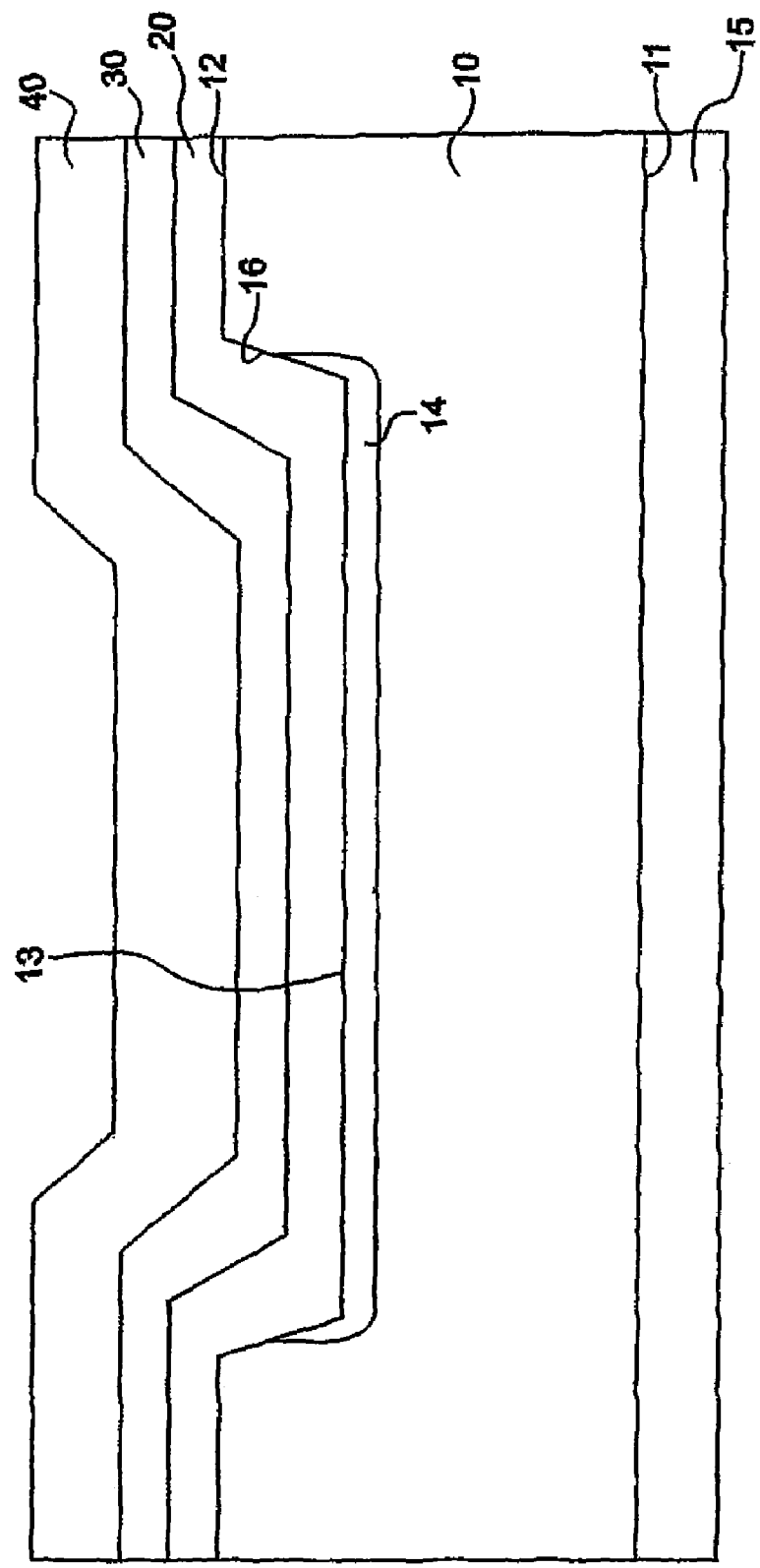
FIG. 3 illustrates a cross-section of the structure after formation of an oxide layer.

In a following process as described with respect to FIG. 3, a low temperature oxide (LTO) layer 40 is grown on n-type silicon carbide layer 30 over the entirety of the structure as illustrated, in a manner as would be understood by one of ordinary skill. For instance, oxide layer 40 may have a thickness in a range of about 1 micrometer, and is shown as having step-like coverage with an indentation above the trench. Oxide layer 40 may be silicon dioxide.

Figure 4:
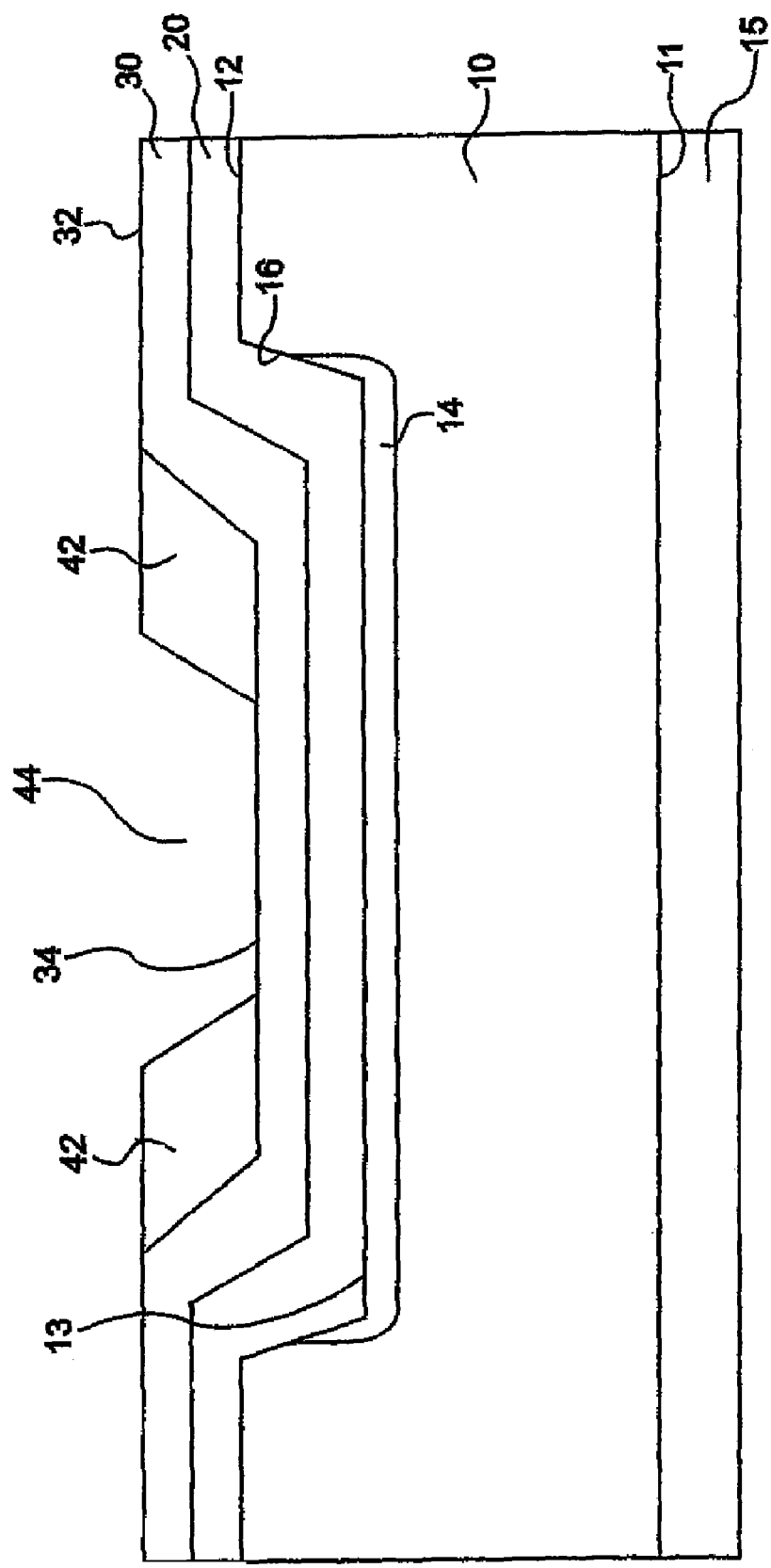
FIG. 4 illustrates a cross-section of the structure after etching the oxide layer to form oxide spacers within the trench.

In a following process as described with respect to FIG. 4, the structure of FIG. 3 is etched using a reactive ion etching (RIE) plasma technique. This particular etching is highly anisotropic and predominantly in the vertical or y-direction shown in FIG. 1, with little or no etching in the horizontal or x-direction. As a result, oxide layer 40 is removed to expose top surface 32 of n-type silicon carbide layer 30. Oxide layer 40 is also etched back within the step-like indentation above the trench to form oxide spacers 42 near sidewalls of the trench, whereby window 44 between oxide spacers 42 exposes surface 34 of n-type silicon carbide layer 30 at a middle area of the trench.

Figure 5:
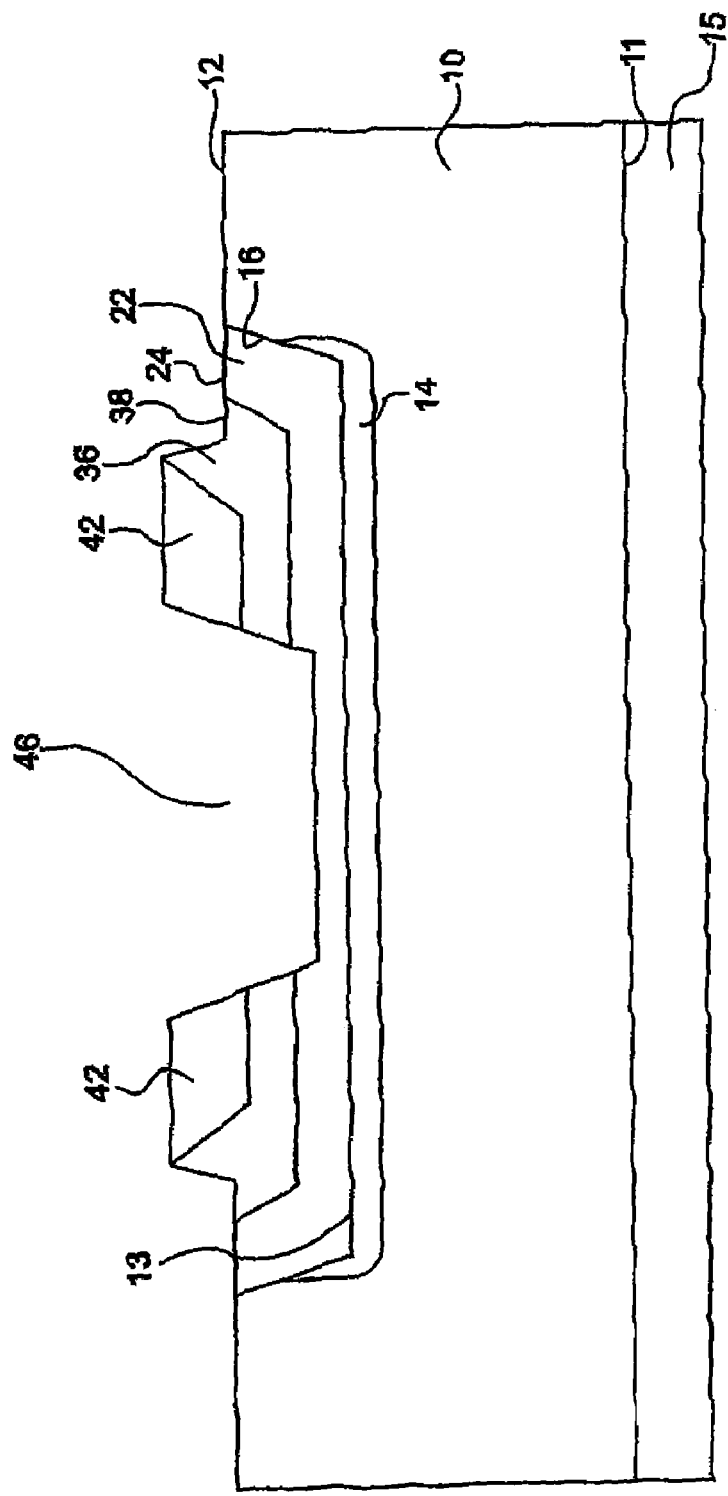
FIG. 5 illustrates a cross-section of the structure after planarization and etching using the oxide spacers as a mask.

In a following process as described with reference to FIG. 5, an etching process is carried out on the structure shown in FIG. 4 to remove portions of p-type silicon carbide layer 20 and n-type silicon carbide layer 30. This etching process may be characterized as including planarization and over-etching, using oxide spacers 42 as a mask. Epitaxially regrown n-type silicon carbide layer 30 and p-type silicon layer 20 are planarized to expose top surface 12 of layer 10. The p-type silicon carbide layer 20 and n-type silicon carbide layer 30 are also planarized above a peripheral area of the trench near sidewall 16 of the trench. The p-type silicon carbide layer remaining within the trench subsequent this etching constitutes a p-type base region 22 of the MOSFET, and includes a top surface 24 at a peripheral area of the trench that is substantially coplanar with top surface 12 of layer 10, as shown in FIG. 5. Also, the n-type silicon carbide layer remaining within the trench constitutes an n$^+$-type source region 36 of the MOSFET, and includes an upper surface 38 substantially coplanar with top surface 12 of layer 10 and top surface 24 of base region 22. Source region 36 also includes a region that extends upwardly above upper surface 38, which region is protected from over-etching by oxide spacer 42. Also, portions of p-type silicon carbide layer 20 and n-type silicon carbide layer 30 within the middle area of the trench are over-etched using oxide spacers 42. A window 46 is thus formed in the middle area of the trench, whereby window 46 extends entirely through source region 36 and partly through base region 22, exposing sidewall surfaces of source region 36 as well as bottom and sidewalls surfaces of base region 22.

Figure 6:
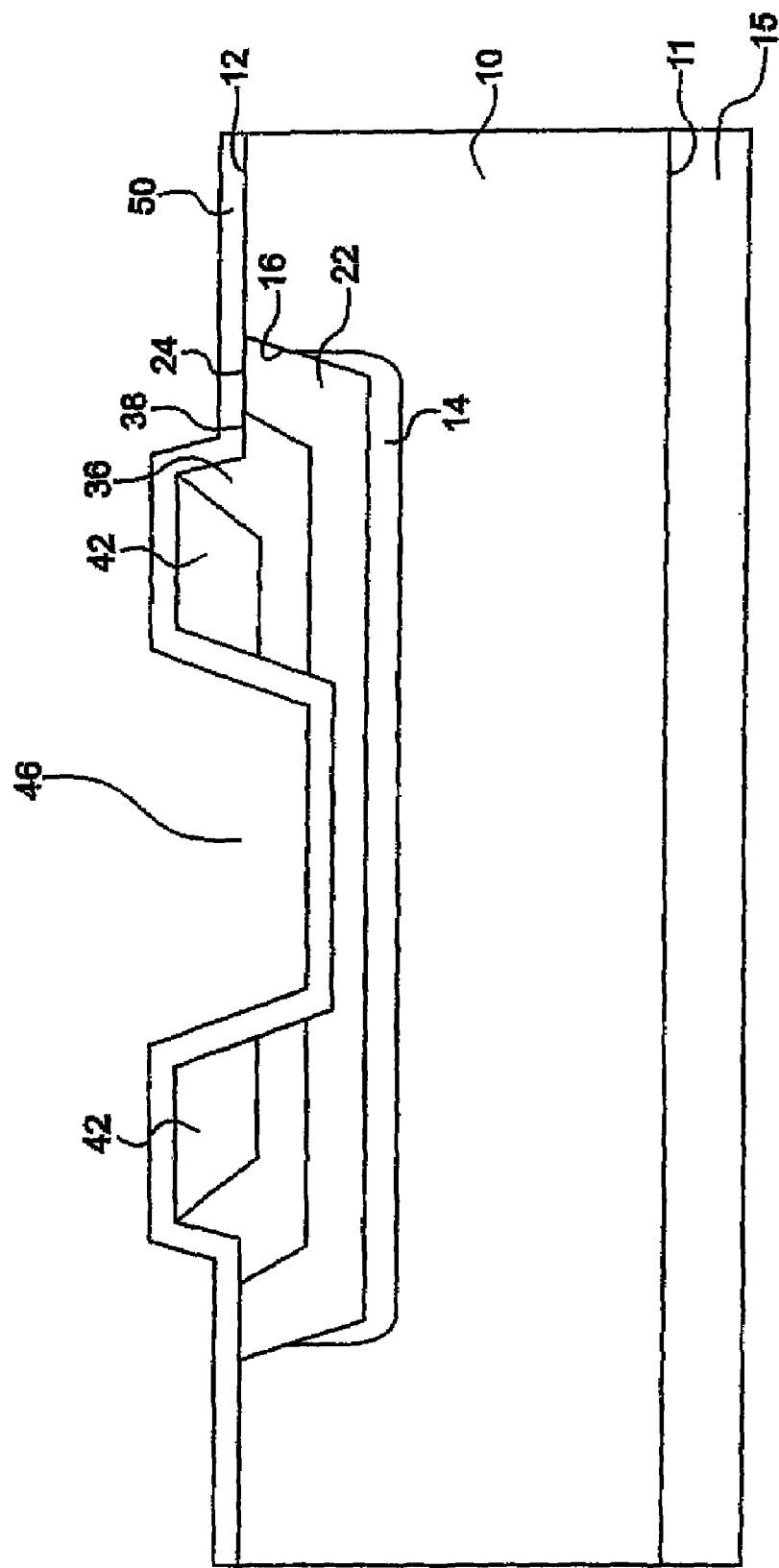
FIG. 6 illustrates a cross-section of the structure after formation of a gate oxide layer.

In a following process as described with reference to FIG. 6, an LTO process is then carried out to from a thin gate oxide layer 50 over the entirety of the structure shown in FIG. 5. Gate oxide layer 50 may be silicon dioxide, and may have a thickness in a range of about 10 to 50 nm. As shown, gate oxide layer 50 is formed on top surface 12 of layer 10, top surface 24 of base region 22, upper surface 38 of source region 36, over oxide spacer 42 and within window 46.

Figure 7:
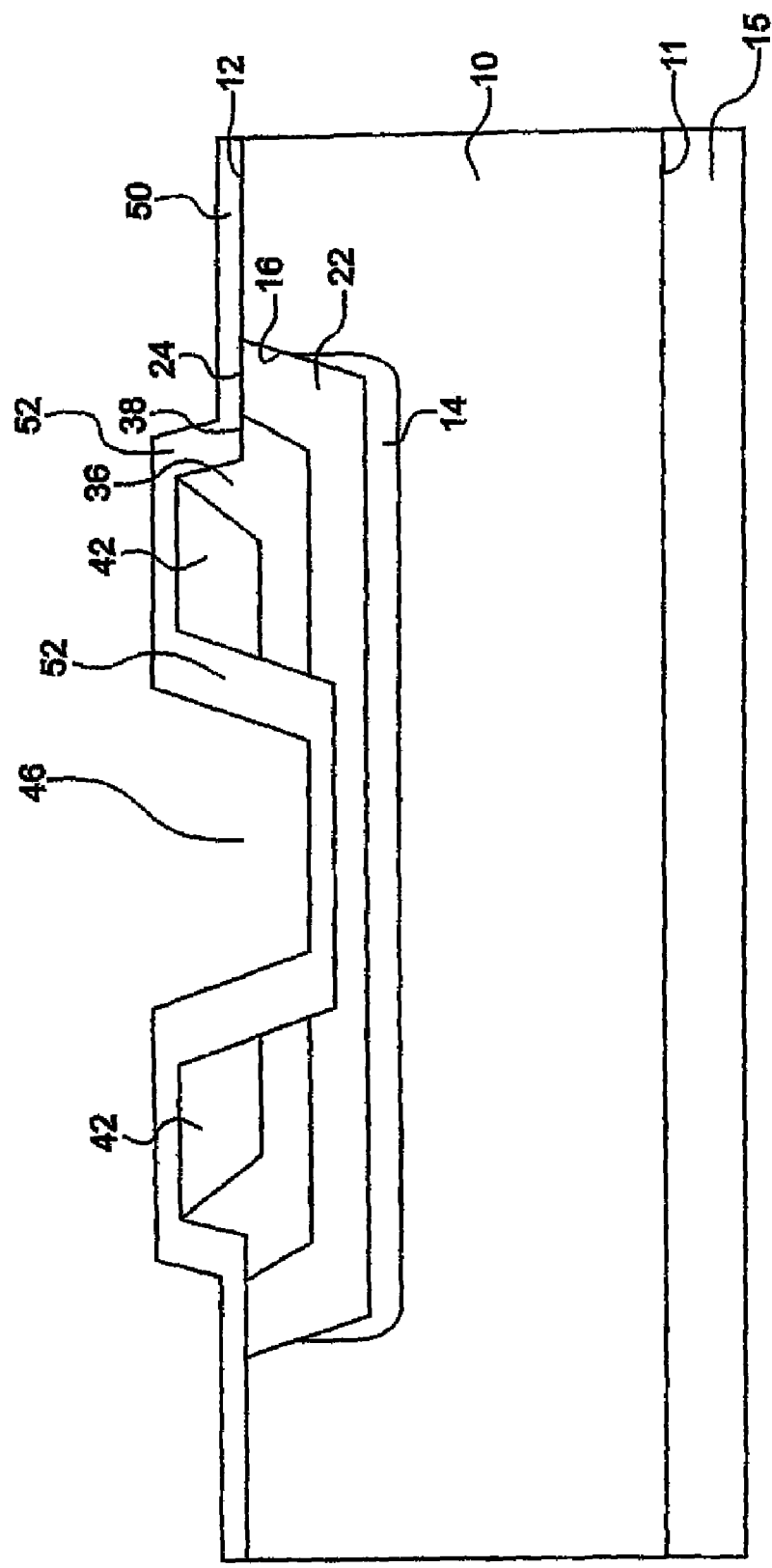
FIG. 7 illustrates a cross-section of the structure after etching the oxide spacer and subsequent gate oxide regrowth.

In a following process as described with reference to FIG. 7, the thickness of gate oxide layer 50 is increased in certain areas. Particularly, the thickness of gate oxide layer 50 is increased at the exposed sidewall surfaces within window 46 and on the sidewall surfaces of oxide spacer 42, including the upwardly extending sidewall surface of source region 36. The thickened gate oxide layers are indicated by reference numeral 52 in FIG. 7. In this two step process, an RIE process that is highly anisotropic predominantly in the vertical direction is first carried out on the structure shown in FIG. 6. Gate oxide layer 50 disposed on surfaces that extend horizontally along the x-direction are thus removed. However, portions of gate oxide layer 50 on surfaces that extend nearly vertical along the y-direction are substantially not etched. Thereafter, another LTO growth process is carried out, whereby oxide having desired thickness is laid down on surfaces that extend horizontally along the x-direction. This laid down oxide is indicated by reference numeral 50 in FIG. 7. This LTO growth process also puts additional oxide on the oxide that remained after the RIE process, that is the oxide on surfaces that extend nearly vertically along the y-direction. As a result, the oxide on the nearly vertically extending surfaces thus have a somewhat thicker composite oxide thereon, as indicated by reference numeral 52 in FIG. 7. This production technique involving increasing oxide layer thickness as described with respect to FIG. 7 is optional. That is, the MOSFET device would function without the above described oxide thickening. An advantage of this production technique is that the thicker gate oxide layers 52 help to reduce capacitance between the subsequently formed gate and source electrodes of the MOSFET.

Figure 8:
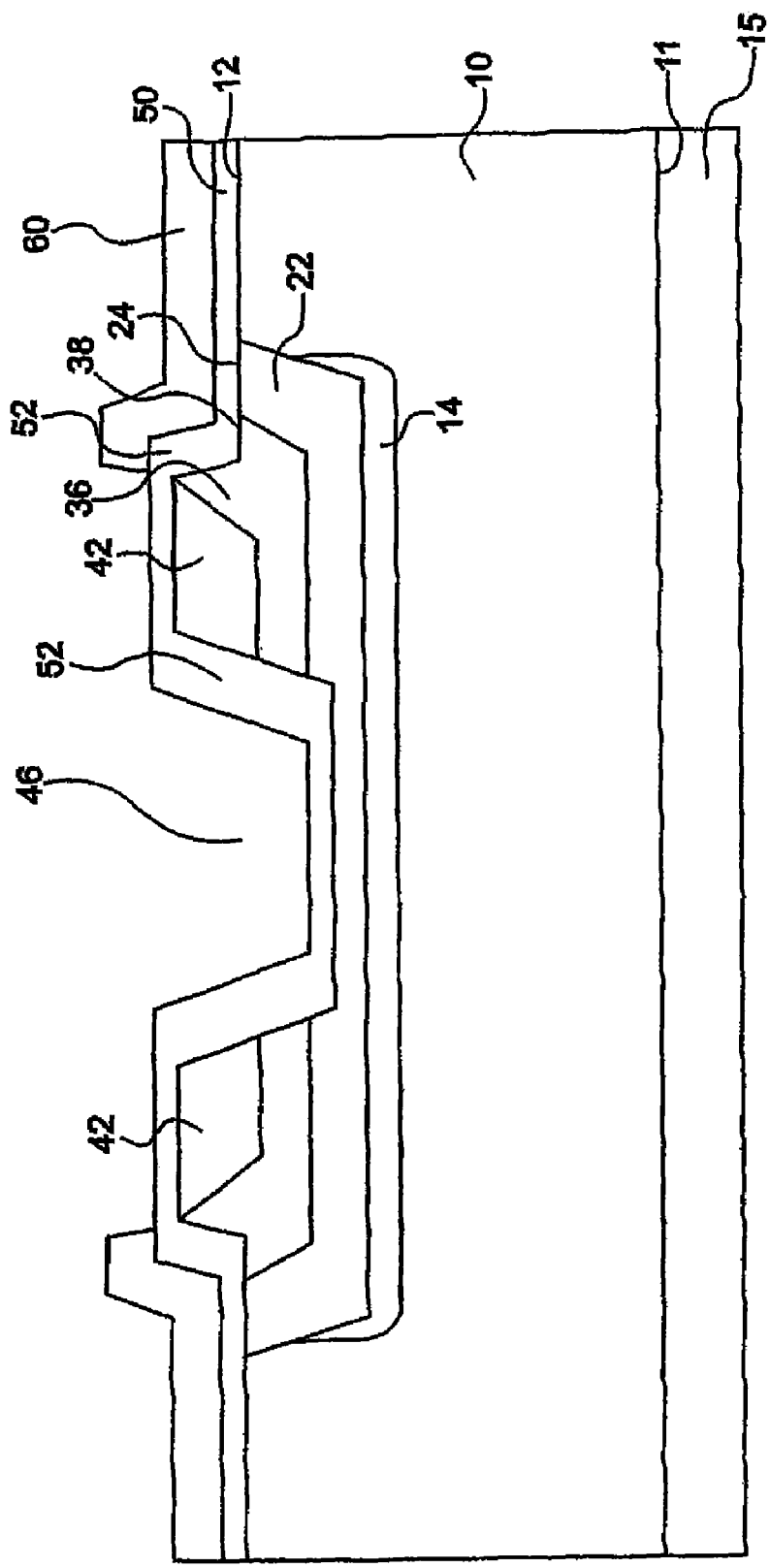
FIG. 8 illustrates a cross-section of the structure after formation of a gate electrode.

In a following process as described with respect to FIG. 8, gate electrode 60 is formed on oxide layer 50 over top surface 12 of layer 10 and top surface 24 of base region 22. Gate electrode 60 extends onto the step-like portion of gate oxide layer 50 over oxide spacer 42. Gate electrode 60 may be polycrystalline silicon deposited using an LPCVD (low pressure chemical vapor deposition) technique. In the alternative, gate electrode 60 may be a metal such as molybdenum or aluminum, among other suitable metals. Such metal electrodes would typically be deposited by a sputtering or evaporation technique. Not shown in FIG. 8 is a mask used during formation of gate electrode 60, such mask being formed and patterned using standard photolithographic techniques as would be understood by one of ordinary skill.

Figure 9:
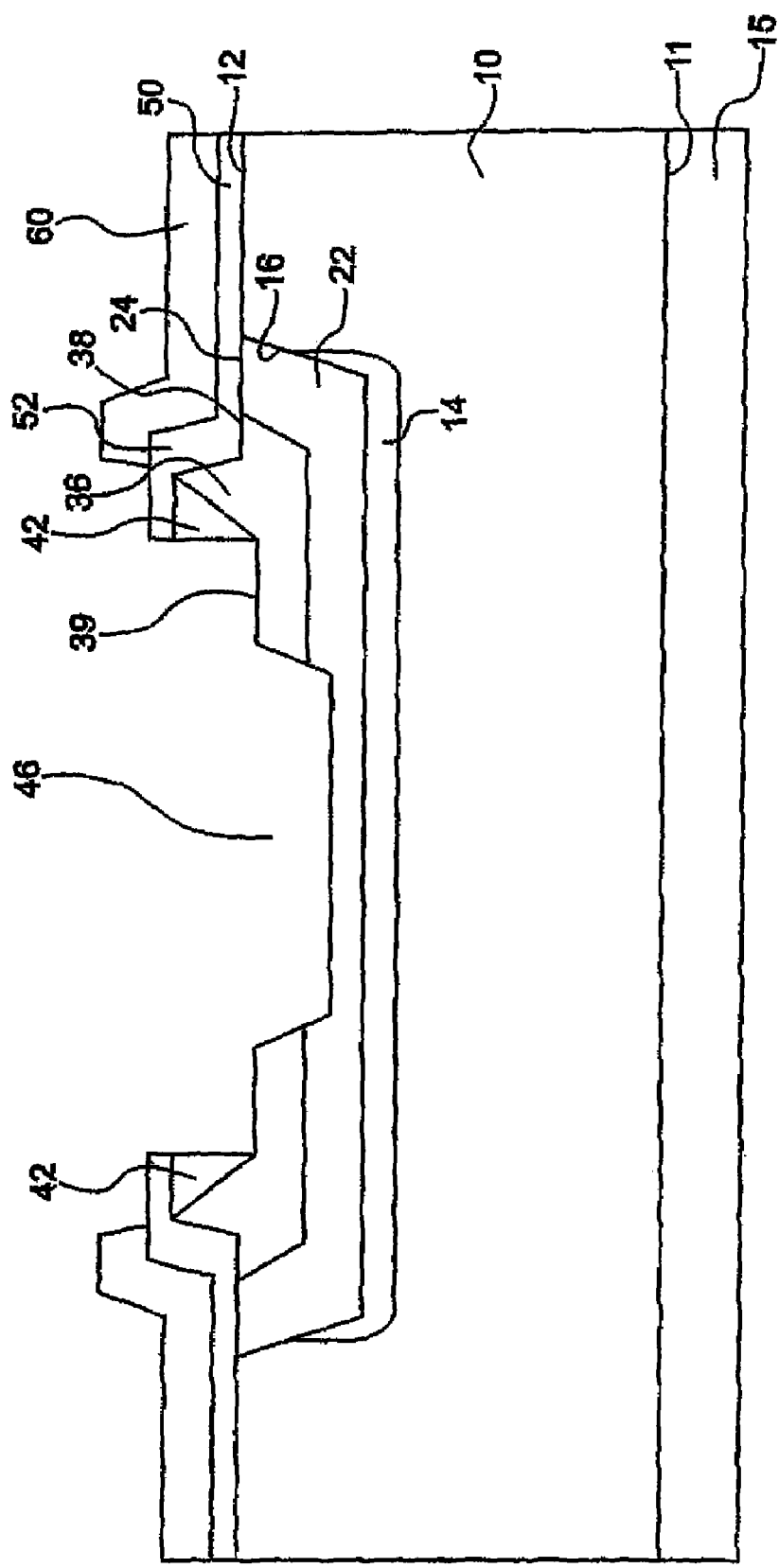
FIG. 9 illustrates a cross-section of the structure after etching within the trench to provide an opening for a source contact.

In a following process as described with respect to FIG. 9, oxide layer 50 and portions of oxide spacers 42 in a middle area above the trench are etched away in preparation of source contact metallization. Although not shown, a resist formed by standard photolithographic techniques is first formed on the structure shown in FIG. 8. The resist covers gate electrode 60 and peripheral portions of oxide spacers 42 nearer to sidewall 16 of the trench. Oxide layer 50 above portions of oxide spacers 42 near the middle area of the trench and oxide layers 50 and 52 within window 46 remain exposed through the unillustrated resist. A two-step etching process is subsequently carried out including an RIE process which removes the majority of oxide layers 50 and 52 and oxide spacers 42 exposed through the resist and a chemical wet etching is subsequently carried out which removes oxide remaining after the initial RIE process. As a result of this two-step etching process, a top surface 39 of source region 36 is exposed within the middle area of the trench between oxide spacers 42, sidewall surfaces of source region 36 are exposed within window 46, and bottom and sidewall surfaces of base region 22 are exposed within window 46.

The etching process as described in connection with FIG. 9 should not be limited merely as a two-step process including an RIE process followed by chemical wet etching. That is, the order of etching may be reversed, or in the alternative a single etching process may be carried out to remove oxide layer 50 within the middle area of the trench. However, etching during an RIE process is predominantly anisotropic in the vertical direction. This helps to maintain oxide spacers 42 wider in the horizontal or x-direction, with minimal undercutting of oxide spacers 42 below the resist mask.

Figure 10:
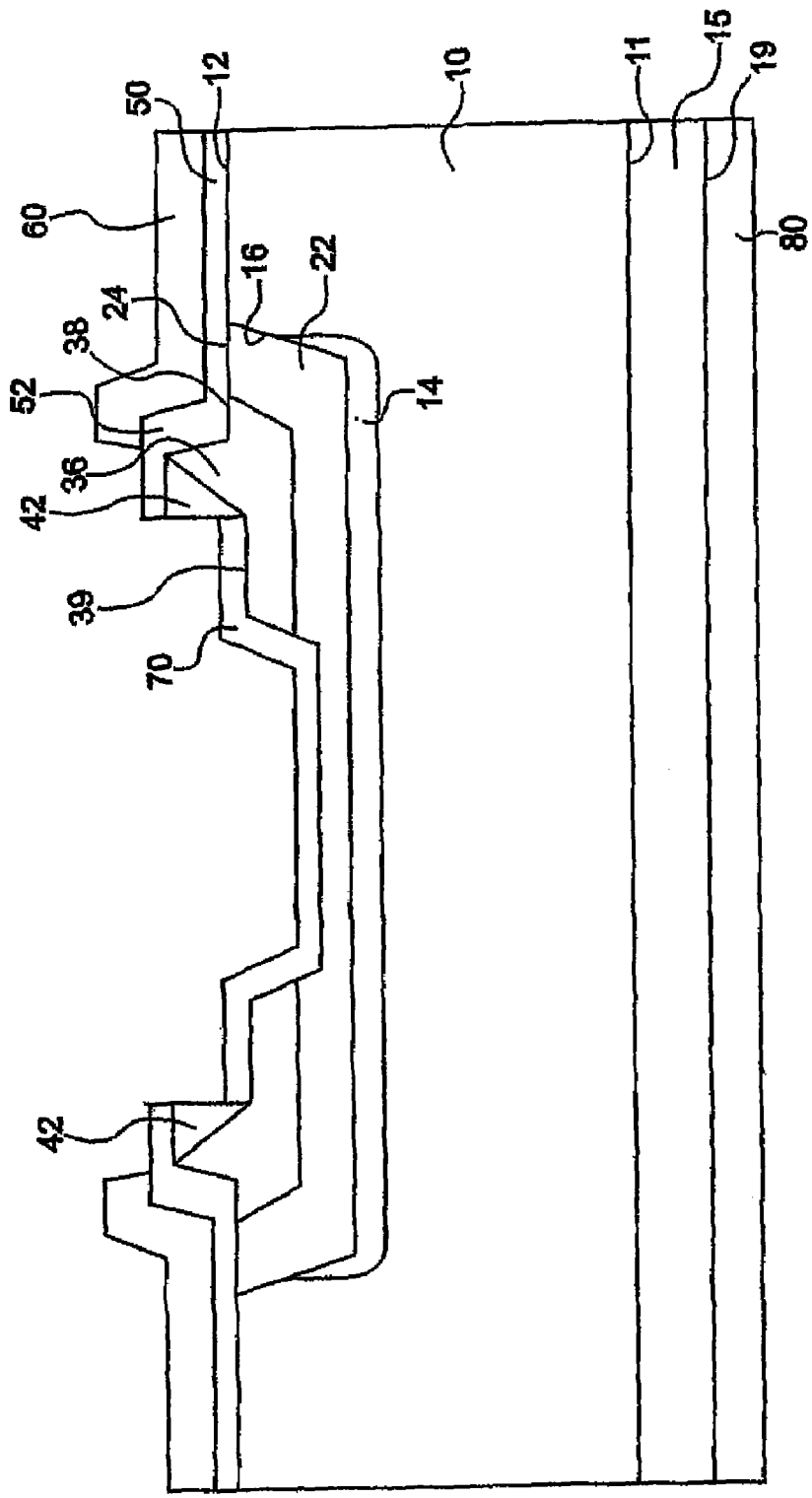
FIG. 10 illustrates a cross-section of the power MOSFET after formation of source and drain electrodes.

In a following process as described with respect to FIG. 10, source contact 70 is formed within the middle portion of the trench between oxide spacers 42, on top surface 39 of source region 36, on sidewall surfaces of source region 36 exposed within window 46, and on bottom and sidewall surfaces of base region 22 within window 46. Source contact 70 is an ohmic contact self-aligned between oxide spacers 42. Typical metals for ohmic source contact 70 include nickel, titanium and titanium-tungsten, among other possibilities. Source contact 70 may be formed by a sputtering or evaporation technique. Drain electrode 80 is subsequently formed on surface 19 of layer 15, whereby drain electrode 80 may also be a metal such as nickel, titanium and titanium-tungsten, among other possibilities. The thus completed MOSFET device is as shown in FIG. 10, wherein source region 36 serves as a common source for respective MOSFETs on opposing sides of the trench along the x-direction.

Operation of the MOSFET device will now be described with reference to FIG. 10. Upon application of a positive voltage to gate electrode 60, an inversion layer is created within base region 22 near top surface 24 under gate oxide layer 50. The positive voltage applied to gate electrode 60 attracts electrons to the interface between top surface 24 of base region 22 and gate oxide layer 50. As electrons are attracted to the interface between top surface 24 of base region 22 and gate oxide layer 50, a current path is provided from source region 36 through to layer 10 located beside the trench. This region of layer 10 beside the trench may be characterized as a channel region. The device is thus turned on upon application of the positive voltage to gate electrode 60, wherein a current path is provided from source contact 70 through source region 36, the inversion layer in base region 22, layer 10, and buffer layer/substrate 15 to drain electrode 80. On the other hands if the voltage applied to gate electrode is negative or zero, electrons are not attracted to the interface between top surface 24 of base region 22 and gate oxide layer 50. In absence of electrons at the interface, an inversion layer is not created and a current path thus does not exist in base region 22 between source region 36 and layer 10. The MOS device is thus turned off. The region of layer 10 below the channel region may be characterized as a blocking drift region.

As described previously with respect to FIG. 2, the p-type silicon carbide layer 20 is epitaxially grown on bottom 13 and sidewall 16 of trench 18. Since the crystal planes of the silicon carbide at bottom 13 and sidewalls 16 within trench 18 are different, the rate of dopant incorporation during epitaxial regrowth can be about 10 times greater in the vertical direction than in the horizontal direction. Accordingly, p-type silicon carbide layer 20 epitaxially grown in a vertical or y-direction on bottom 13 of trench 18 has greater dopant concentration than p-type silicon carbide layer 20 epitaxially grown laterally in a horizontal or x-direction from sidewall 16 of trench 18. Thus, the p-type dopant concentration in base region 22 of the MOSFET device shown in FIG. 10 is generally greater at bottom 13 of the trench, and generally lower near the interface between top surface 24 of base region 22 and gate oxide layer 50. As a result of this anisotropic nature of dopant incorporation during epitaxial regrowth of silicon carbide, the threshold voltage at which electrons begin to accumulate at top surface 24 of base region 22 is maintained low. That is, the anisotropic nature of the dopant incorporation is relied on to maintain low turn-on voltage. The dopant concentration may however be controlled during epitaxial regrowth of p-type silicon carbide layer 20 to be increased at top surface 24 of base region 22, so as to realize a higher turn-on voltage if desired for a given application.

As noted above, because of the anisotropic dopant incorporation rate during epitaxial regrowth, the dopant concentration of base region 22 of FIG. 10 is relatively greater at the bottom of the trench. This helps to block high voltage from the top of the device where the gate electrode controls the device. Incidentally, p$^+$-type impurity region 14 as described previously with reference to FIG. 1 also helps to block high voltage from reaching the top of the device. However, the provision of a high dopant concentration in base region 22 at the bottom of the trench and the use of impurity region 14 are not necessary to operate the MOSFET of FIG. 10. Different dopant profiles within base region 22 may be realized if desired.

In a further alternative embodiment, the dopant profile of layer 10 in FIG. 10 may be non-uniformly graded in the vertical or y-direction. For example, layer 10 may be epitaxially grown so that the n-type dopant concentration is lowest near a middle portion of layer 10 in the vertical direction, and so that the n-type dopant concentration increases approaching bottom and top surfaces 11 and 12 of layer 10. That is, dopant concentration of layer 10 would be lowest near the bottom of trench 18. Upon turning the MOSFET off, this dopant profile would help to remove charges or carriers at the bottom of the trench as quickly as possible. The effectiveness of the depletion would thus be increased at the bottom of the trench compared to portions of layer 10 slightly higher above the bottom of the trench. This would help to maintain the electric field at the oxide interface as low as possible. A low electric field at the SiC oxide interface is important for the long term stability of the device. High electric field may result in injection of charge into the oxide and subsequent degradation of device performance.

A further advantage of epitaxially regrowing base region 22 on layer 10 within the trench, in contrast to ion implanting a base region into an existing layer as in conventional DIMOS technology, is that ion implantation damages an existing layer. In the case where the base region is conventionally formed by ion implantation, lower electron mobility is realized because of the inflicted damage. A higher quality base region is thus provided by epitaxially regrowth, resulting in improved devices. This is also true with respect to source region 36. Higher dopant concentration and electron mobility may be realized by epitaxially regrowing base region 22 and source region 36.

A further aspect of the metallization process of FIG. 10 will now be described. When forming contacts in general, high temperature annealing may be carried out to improve the quality of the contact material. However, if the metal contact layers are too thick to begin with, the metal will have a tendency to flow at the edges during annealing, creating contacts with rough edges. To avoid rough edges, source contact 70 in FIG. 10 may be formed in a two-step process. In this alternative embodiment, source contact 70 is first formed as a thin layer of metal such as nickel, titanium, or titanium-tungsten by a sputtering or evaporation technique such as described previously. This thin layer is then annealed to ensure that a good interface is made with the underlying semiconductor material. A second layer of the corresponding metal is thereafter formed on the annealed metal by a further sputtering or evaporation technique. Formation of drain electrode 80 may be carried out in a similar manner.

Although the present invention has been described in detail, the scope of the invention should not be limited by the corresponding description and figures. For example, although silicon carbide epitaxial layers are described, epitaxial layers made of other semiconductors such as gallium nitride or diamond may be used. Also, the concepts described above should be applicable as well for the case wherein the conductivity types of layer 10 and source region 36 are p-type, and the conductivity of base region 22 is n-type. Moreover, the alternative embodiments including implanting impurity region 14, providing layer 10 with a vertical dopant profile, and providing base region 22 as having lower dopant concentration near surface 24 and greater dopant concentration near the bottom of the trench, should not be limited as to be usable separately, but these alternative embodiments may be applied variously together in combination. These various changes and modifications of the preferred embodiments, as would become apparent to one of ordinary skill, should be considered as within the spirit and scope of the invention.

What is claimed is:
1. A method of manufacturing a MOSFET comprising:
   forming a trench in a first layer, the first layer having opposite first and second surfaces, the trench extending into the first layer from the first surface;
   epitaxially growing a second layer and then a third layer within the trench and over the first surface of the first layer;
   etching the second and third layers using a mask to expose the first surface, to remove the third layer and part of the second layer within a middle area of the trench, and to expose a surface of the second layer in a peripheral area of the trench, to provide a first structure;
   forming a gate oxide layer on the first structure;
   forming a gate electrode on the gate oxide layer over the surface of the second layer;
   etching the gate oxide layer within the middle area of the trench;
   forming a source electrode within the middle area of the trench in contact with the second and third layers; and
   forming a drain electrode over the second surface of the first layer, wherein the first and third layers have a conductivity type opposite a conductivity type of the second layer.

2. The method of manufacturing a MOSFET of claim 1, further comprising:
    implanting an impurity region into a bottom of the trench before said epitaxially growing a second layer, the impurity region having a same conductivity type as the second layer and a dopant concentration greater than a dopant concentration of the second layer.

3. The method of manufacturing a MOSFET of claim 1, wherein the second layer is epitaxially grown as having a non-uniform dopant profile with a dopant concentration lowest near the surface of the second layer.

4. The method of manufacturing a MOSFET of claim 1, wherein the first layer is epitaxially grown as having a dopant profile graded in a vertical direction from the first surface to the second surface, with dopant concentration lowest near a bottom of the trench and greater near the first and second surfaces.

5. The method of manufacturing a MOSFET of claim 1, wherein the first and third layers have n-type conductivity and the second layer has p-type conductivity.

6. The method of manufacturing a MOSFET of claim 1, wherein the first, second and third layers are silicon carbide.

7. A method of manufacturing a MOSFET comprising:
    forming a trench in a first layer, the first layer having a first conductivity type and opposite first and second surfaces, the trench extending into the first layer from the first surface;
    epitaxially growing a second layer within the trench and on the first surface of the first layer, the second layer having a second conductivity type opposite the first conductivity type;
    epitaxially growing a third layer on the second layer within the trench and over the first surface of the first layer, the third layer having the first conductivity type;
    forming a first oxide layer on the third layer within the trench and over the first surface of the first layer;
    etching the first oxide layer substantially vertically so that the first oxide layer remains only over the trench as oxide spacers and so that the third layer is exposed between the oxide spacers, to provide a first structure;
    etching the first structure using the oxide spacers as a mask to expose the first surface, to remove the third layer and part of the second layer between the oxide spacers, and to expose a surface of the second layer within the trench that is not between the oxide spacers, to provide a second structure;
    forming a gate oxide layer on an entirety of the second structure;
    forming a gate electrode on the gate oxide layer over the surface of the second layer;
    etching the gate oxide layer between the oxide spacers;
    forming a source electrode between the oxide spacers in contact with the second and third layers; and
    forming a drain electrode over the second surface of the first layer.

8. The method of manufacturing a MOSFET of claim 7, further comprising:
    implanting an impurity region into a bottom of the trench before said epitaxially growing a second layer, the impurity region having the second conductivity type and a dopant concentration greater than a dopant concentration of the second layer.

9. The method of manufacturing a MOSFET of claim 7, wherein the second layer is epitaxially grown as having a non-uniform dopant profile with a dopant concentration lowest near the surface of the second layer.

10. The method of manufacturing a MOSFET of claim 7, wherein the first layer is epitaxially grown as having a dopant profile graded in a vertical direction from the first surface to the second surface, with a dopant concentration lowest near a bottom of the trench and greater near the first and second surfaces.

11. The method of manufacturing a MOSFET of claim 7, wherein the first, second and third layers are silicon carbide.

12. The method of manufacturing a MOSFET of claim 7, wherein the first conductivity type is n-type and the second conductivity type is p-type.

13. The method of manufacturing a MOSFET of claim 7, wherein said etching the gate oxide layer comprises etching the gate oxide layer and portions of the oxide spacers using a reactive ion etching process and a chemical wet etching process.

14. A method of manufacturing a MOSFET comprising:
    forming a trench in a first layer;
    epitaxially growing a second layer within the trench and on the first layer outside the trench;
    epitaxially growing a third layer on the second layer;
    forming spacers on the third layer over the trench;
    etching the second and third layers using the spacers as a mask to remove the third layer and a part of the second layer between the spacers, and to expose the first layer outside the trench;
    etching the spacers after said etching the second and third layers, to further expose the third layer within the trench and so that portions of the spacers remain; and
    forming a source electrode on the second and third layers between the remaining portions of the spacers.

15. The method of manufacturing a MOSFET of claim 14, wherein the first and third layers are a first conductivity type, and the second layer is a second conductivity type opposite the first conductivity type, the method further comprising:
    implanting an impurity region into a bottom of the trench before said epitaxially growing a second layer, the impurity region having the second conductivity type and a dopant concentration greater than a dopant concentration of the second layer.

16. The method of manufacturing a MOSFET of claim 15, wherein the first conductivity type is n-type and the second conductivity type is p-type.

17. The method of manufacturing a MOSFET of claim 14, further comprising:
    forming a gate oxide layer on the second layer over a peripheral area of the trench;
    forming a gate electrode on the gate oxide layer; and
    forming a drain electrode over a surface of the first layer.

18. The method of manufacturing a MOSFET of claim 14, wherein the second layer is epitaxially grown as having a non-uniform dopant profile with a dopant concentration lowest near an upper surface of the second layer.

19. The method of manufacturing a MOSFET of claim 14, wherein the first layer is epitaxially grown as having a dopant profile graded in a vertical direction, with dopant concentration lowest near a bottom of the trench and greater near top and bottom surfaces of the first layer.

20. The method of manufacturing a MOSFET of claim 14, wherein the first, second and third layers are silicon carbide.

* * * * *